(12) United States Patent
Oyoshi et al.

(10) Patent No.: US 6,291,060 B1
(45) Date of Patent: Sep. 18, 2001

(54) WATER-DEVELOPABLE PLATE PACKAGE

(75) Inventors: Takeshi Oyoshi; Yoshifumi Araki, both of Fuji (JP)

(73) Assignee: Asahi Kasei Kabushiki Kaisha (JP)

(*) Notice: Subject to any disclaimer, the term of this patent is extended or adjusted under 35 U.S.C. 154(b) by 0 days.

(21) Appl. No.: 09/486,650

(22) PCT Filed: Aug. 26, 1998

(86) PCT No.: PCT/JP98/03795

§ 371 Date: Feb. 25, 2000

§ 102(e) Date: Feb. 25, 2000

(87) PCT Pub. No.: WO99/10253

PCT Pub. Date: Mar. 4, 1999

(30) Foreign Application Priority Data

Aug. 26, 1997 (JP) .................................... 9-229111

(51) Int. Cl.$^7$ .......................... B65D 81/26; B65D 57/00
(52) U.S. Cl. .................... 428/318.4; 428/319.3; 428/319.7; 430/155; 430/162; 430/167; 430/271.1; 430/273.1; 430/285.1; 430/909; 430/281.1
(58) Field of Search ............... 428/318.4, 319.3, 428/319.7; 430/271.1, 273.1, 285.1, 909, 281.1, 167, 162, 155, 281, 287, 288

(56) References Cited

U.S. PATENT DOCUMENTS

| | | | |
|---|---|---|---|
| 3,901,240 | 8/1975 | Hoey | 128/296 |
| 4,565,733 | 1/1986 | Akao | 428/215 |
| 4,806,404 | 2/1989 | Cascino | 428/40 |
| 5,006,447 * | 4/1991 | Umeda et al. | 430/237 |
| 5,177,171 | 1/1993 | Usubuchi et al. | 528/83 |
| 5,187,044 * | 2/1993 | Prioleau et al. | 430/271 |
| 5,221,589 * | 6/1993 | Nanba et al. | 430/283 |
| 5,863,704 * | 1/1999 | Sakurai et al. | 430/271.1 |
| 6,210,845 * | 4/2001 | Grossman et al. | 430/138 |

FOREIGN PATENT DOCUMENTS

| | | | |
|---|---|---|---|
| 0 057 593 | 8/1982 | (EP) | G03F/7/02 |
| 0 564 947 | 10/1993 | (EP) | D21H/25/18 |
| 3-206456 | 9/1991 | (JP) | G03F/70/35 |
| 4-53629 | 5/1992 | (JP) | B65D/25/04 |
| 08039710 A | 2/1996 | (JP) | B32B/5/18 |
| 08175572 A | 7/1996 | (JP) | B65D/81/26 |

* cited by examiner

Primary Examiner—Blaine Copenheaver
Assistant Examiner—Hai Vo
(74) Attorney, Agent, or Firm—Pennie & Edmonds LLP

(57) ABSTRACT

The present invention concerns a water-developable plate package comprising water-developable plates packaged in a laminated state. The water-developable plate is a sheet-like plate comprising a photosensitive layer made of a photosensitive resin composition having water-developability and protective films covering both surfaces of this photosensitive layer. The package of the present invention is obtained by sandwiching an open cell foamed sheet (2) between a water-developable plate (1) and between a water-developable plate (1) to make a laminate (3), packaging the laminate (3) with a light-screening film and fixing the packaging ends with a tape. The subject of the present invention is to prevent the occurrence of deformation of the plates in the package during transportation or storage at a high temperature and high humidity in summer, without complicating the operations at the time of use or packaging of the plates and without increasing the cost remarkably.

4 Claims, 2 Drawing Sheets

WATER-DEVELOPABLE PLATE PACKAGE

TECHNICAL FIELD

The present invention concerns a package in which water-developable plates are packaged in a laminated state for transportation or storage. The plate constituting the package is a sheet-like plate comprising a photosensitive layer made of a photosensitive resin composition having water-developability and protective films covering both surfaces of the photosensitive layer.

BACKGROUND ART

A water-developable plate is a plate in which a photosensitive layer is hydrophilic before exposure and a relief image is formed by crosslinking an image-forming area by the exposure. Accordingly, the plate is subjected to a developing treatment after the exposure (removal of unexposed area of the photosensitive layer) with water or an aqueous alkali solution. On the other hand, a solvent-developable plate requires a developing treatment after exposure using an organic solvent, which is troublesome in handling. Therefore, the water-developable plate which is more simple in the developing treatment has become predominant as a plate for use in letterpress.

On the other hand, the plate is in the form of a sheet and usually has a structure of covering both surfaces of photosensitive layer of a predetermined thickness comprising a photosensitive resin composition with protective films. In transportation and storage, a plurality of sheet-like plates are laminated and a laminate is packaged with a light screening film and placed, for example, in a corrugated board box. The water-developable plate involves a problem of causing deformation in the plate during transportation or storage at a high temperature and a high humidity in summer.

It is considered that the problem is attributable to easy moisture absorption since the photosensitive layer of the water-developable plate is hydrophilic. Therefore, for preventing moisture absorption of the water-developable plate at a high temperature and a high humidity in summer, the following countermeasures have been adopted in the prior art. That is, in a case of a solvent-developable plate, when a laminate of plates are packaged with a light screening film 4 into a package 6, only the packaging ends are secured at several positions by tapes 5, for example, as shown in FIG. 3(a), but in a case of a water-developable plate, all of the portions through which moisture can intrude are secured with a tape 5, for example, as shown in FIG. 3(b). Alternatively, the humidity is lowered in a transportation environment or a storage site for the package.

However, the package of the plates are usually packaged on every about ten sheets with a light screening film and they are used in most cases such that about two or three sheets of them are taken out per one day while other remaining plates are stored. Accordingly, in the countermeasures described above, a method of securing all the portions of the light screening film through which moisture can intrude complicates the tape securing operation after taking out the plates.

As a method of avoiding this complication, it may be considered to package plates sheet by sheet. However, since this requires the stringent packaging described above on each sheet for all plates, the operation upon packaging is troublesome. Further, the countermeasure for lowering the humidity in the transportation circumstance or the storage site of the package involves a problem in view of the cost and reliable moisture proofness.

The present invention has been accomplished taking notice on such problems in the prior art and it is a subject thereof to prevent occurrence of deformation of the plates in a package in which water-developable plates are packaged in a laminated state during transportation or storage at a high temperature and a high humidity in summer, without complicating the operations at the time of use or packaging of plates and without increasing the cost remarkably.

DISCLOSURE OF THE INVENTION

For solving the foregoing subject, the present invention provides a water-developable plate package in which sheet-like plates each comprising a photosensitive layer made of a photosensitive resin composition having water-developability and protective films covering both surfaces of the photosensitive layer are packaged in a laminated state for transportation or storage, wherein an open cell foamed sheet is sandwiched between a plate and another plate.

In this case, since the photosensitive layer of the water-developable plate is hydrophilic, it tends to absorb moisture, but the moisture is absorbed mainly from the end faces of the photosensitive layer in a package in which only the water-developable plates are laminated. Thus, only the portion near the end faces (edges) of the photosensitive layer formed at a uniform thickness is swollen greatly, while portions near the central area remain substantially unchanged for the thickness with respect to the initial state. That is, it is considered that deformation of the plate as described above occurs in the package in which only the water-developable plates are laminated because of uneven hygroscopicity in a plane of the photosensitive layer.

Based on the finding described above, the present inventors found that deformation of the water-developable plate can be suppressed by allowing moisture to be absorbed uniformly within a plane of the photosensitive layer, instead of preventing moisture absorption in the photosensitive layer and have accomplished the present invention.

According to the water-developable package of the present invention, since an open cell foamed sheet is sandwiched between the plates, moisture is absorbed by the plate not only from the end faces but also from the vicinity of the central area of the plate. That is, since moisture is absorbed in the package also through the foamed sheet, and moisture entering from the end faces to the cells inside of the foamed sheet transfers through the open cells in the direction of the thickness and in the direction of the plate plane of the foamed sheet, moisture reaches through the foamed sheet also to the central area of the plate.

Since this moderates ununiform absorption of moisture in the plane of the plate during transportation or storage, deformation of the plate is suppressed.

Further, even when the plates are laminated in a state where dusts are deposited on the outer surface of the protective film, since the foamed sheet functions as a buffer in the water-developable package of the present invention, unevenness caused by dusts is less formed in the photosensitive layer.

In the water-developable plate package according to the present invention, higher air permeability of the foamed sheet to be used is preferred since moisture tends to reach through the foamed sheet as far as the central area of the plate more easily. Specifically, it is preferred to use a foamed sheet having an air permeability of 0.1 cc/(cm$^2$·sec) or more based on air permeability measurement according to "JIS L-1096 A method", and it is more preferred to use a foamed sheet of 1.0 cc/(cm$^2$·sec) or more.

Further, since a foamed sheet having a particularly high air permeability has a low compression strength and makes it difficult to stably hold plates, the air permeability of the foamed sheet used in the water-developable plate package according to the present invention is preferably 500 cc/(cm²·sec) or less based on in the air permeability measurement described above. Further, while there is no particular restriction on the thickness of the foamed sheet used in the water-developable plate package according to the present invention, it is preferred that the thickness is, for example, approximately equal with the thickness of the photosensitive layer of the plate (generally, 0.5 mm or more and 10.0 mm or less).

Further, the open cell foamed sheet is generally prepared by a method of blowing a polymer such as urethane rubber, ethylene propylene rubber or polyethylene to at first form a block or sheet having closed cells entirely, and then communicating the closed cells with each other under compression with a roll, for example. When the sheet is prepared by this method, a foamed sheet of a structure in which cells are connected in the direction of the plane and in the direction of the thickness of the plate and open cells are placed three-dimentionally is obtained. Further, layers free of cells (skin layers) are formed on the surface and the rearface of the foamed sheet prepared by this method.

As the foamed sheet used in the present invention, those in which the skin layers described above are removed and open cells are present to at least one of the surface and the rearface are preferred, but those not removed with the skin layers may also be used so long as the skin layers are thin (thickness of the skin layer is, for example, 50 μm or less, preferably, 10 μm or less).

In the water-developable plate package according to the present invention, a foamed sheet to be used having higher flexibility is preferred since unevenness caused by dusts as described above are less formed to the photosensitive layer. Specifically, compression ratio in the direction of the thickness under a pressure of 30 g/cm² is preferably 0.5% or more and, more preferably, 1.0% or more. Further, since the plate is less stabilized undesirably during transportation if the flexibility of the foamed sheet used is excessively high, it is preferred to use a foamed sheet with the compression ratio of 50.0% or less. More preferably, a compression ratio of the foamed sheet is 30.0% or less.

In the present invention, the compression ratio of the foamed sheet is a value obtained by the following method. That is, a foamed sheet (10×10 cm) is placed on a flat surface, on which an aluminum plate (10×10 cm, 1 mm thickness) is placed and the thickness (X) of the foamed sheet is measured in this state. Then, a weight of 3 kg is placed on the aluminum plate and the thickness (Y) of the foamed sheet is measured under this compressed state. A value calculated by dividing the amount (X-Y) of change in the thickness with the thickness (X) of the foamed sheet before compression and further multiplying by 100 is defined as a compression ratio.

Generally produced water-developable plates have a shape of a thickness of 0.5 mm or more and 10 mm or less, and having a planar shape of a square with 50 mm length for each side in a case of a smaller size and a rectangle of 1500 mm×3000 mm in a larger case. Since deformation of the plate in the laminate tends to be caused more easily as the area of the surface of the plate is larger, the effect of the present invention by interposing the open cell foamed sheet is increased.

Specifically, the effect of the present invention is particularly remarkable in a case where the laminated plate is formed into a sheet shape of a thickness of 0.5 mm or more or 10 mm or less and having a planar shape of a square with 700 mm length or more for each side or that of a rectangle with 700 mm length or more for two sides orthogonal to each other.

The plate constituting the water-developable plate package according to the present invention comprises a photosensitive layer made of a photosensitive resin composition having water-developability and protective films. The photosensitive resin composition having water-developability generally comprises a hydrophilic thermoplastic elastomer, a plasticizer, crosslinkable monomers, a photo-initiator, and a stabilizer, as well as additives such as a sensitizing agent, a surface active agent and a gelling agent, and is developable with an aqueous treating solution. It can include, specifically, a photosensitive resin composition such as described in U.S. Pat. No. 5,177,171 (registered number), containing a sulfonic group-containing polyurethane as the thermoplastic elastomer, a maleic modification product of polybutadiene diol and glycerine monomethacrylate as the crosslinkable monomers, 2,2-dimethoxyphenyl acetophenone as the photo-initiator and 2,6-di-t-butyl-p-cresol as the stabilizer.

The aqueous treating solution includes water or an aqueous solution with a water content of 50% or more comprising water with optional addition of a surfactant, a defoamer, a dispersant, an emulsifier, a corrosion suppressant, a petrifaction inhibitor, a pH controller, a water soluble solvent, a water dispersible solvent and the like.

As the protective film for the plate, a film comprising a thermoplastic polymer is used generally and, specifically, films such as of polyethylene, polypropylene, polystyrene and polyester can be used. Among the films, a polyester film is used suitably in view of the heat resistance and the mechanical strength. Further, the thickness of the protective film is generally from 50 μm to 200 μm and those with a thickness of about 100 μm are used most generally.

Further, the plate may optionally have layers other than the photosensitive layer and the protective film. Such layers can include, for example, a bonding layer for bonding the photosensitive layer and the protective film, an adhesion preventive layer for preventing stiking with a negative film, and a closed cell foamed sheet for improving the cushioning performance during printing. As a method of disposing the layers to the plate it is most general to previously bond the layers to the protective film, extrude a resin composition forming the photosensitive layer in the foam of a sheet and sandwich the upper and lower surfaces thereof between the protective films, thereby integrating them together with the protective films into the photosensitive layer.

BEST MODE FOR PRACTICING THE INVENTION

Figure 1:
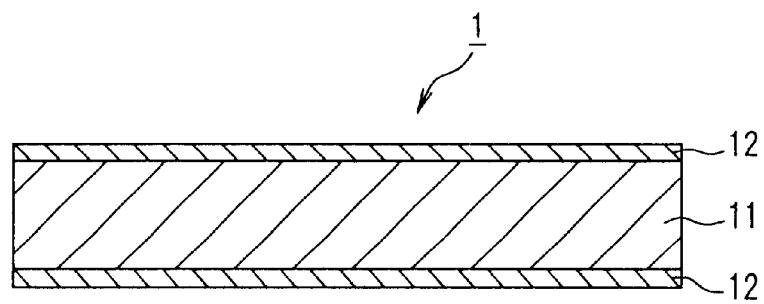
FIG. 1 is a cross sectional view showing a structure of a water-developable plate.

An embodiment of the present invention is to be explained.

Preparation of Water-Developable Plate
(1) Synthesis of sulfonic group-containing polyurethane At first, 296 kg of sodium sulfoisophthalate dimethyl ester, 310 kg of ethylene glycol, 0.43 kg of N,N'-hexamethylene bis(3,5-di-t-butyl-4-hydroxy dihydro cinnamylamide) (IRGANOX 1098: manufactured by Ciba Geigy), and 0.43 kg of zinc acetate were charged in a synthesis vessel equipped with a stirrer, an introducing port and a discharge tube of nitrogen and reacted at 200° C. for 5 hours in a nitrogen atmosphere. Subsequently, unreacted ethylene glycol was distilled off under a reduced pressure, to obtain pale yellow sulfonic group-containing polyester diol having hydroxyl groups at terminal ends. The number average molecular weight of the thus obtained sulfonic group-containing polyester diol was 492 when calculated based on the measurement for the hydroxyl value.

Then, after charging 13 kg of the sulfonic group-containing polyester diol, 120 kg of polyisoprene diol having hydroxyl groups on both terminal ends with a number average molecular weight of 2439 (manufactured by Idemitsu Petrochemical Co.), and 200 g of octylated diphenylamine [NOCRAC AD: manufactured by Ouchi Shinko Chemical Co.] to a synthetic vessel equipped with a stirrer, an introducing port and a discharge tube of nitrogen, 330 kg of dimethylacetoamide and 330 kg of 2-chlorotoluene were added and heated at 110° C. to form a homogeneous solution.

Then, 36 g of dibutyl tin dilaurate and 108 g of stannous octate were added to the solution and reacted while dropping 18.5 kg of xylylene diisocyanate at 110° C. for 3 hours. Subsequently, dimethyl acetoamide and 2-chlorotoluene were distilled off under a reduced pressure to obtain a homogeneous and transparent sulfonic group-containing polyurethane.

(2) Preparation of photosensitive resin composition having water-developability 40 parts by weight of the sulfonic group-containing polyurethane obtained in (1) above, 30 parts by weight of a styrene—isoprene block copolymer [CARIFLIX TR1107: manufactured by Shell Chemical], 2.5 parts by weight of sodium laurylbenzene sulfonate, 6 parts by weight of polybutadiene diacrylate (BAC-45: manufactured by Osaka Yuki Kagaku], 2.0 parts by weight of aliphatic diacrylate [C-2000: manufactured by Satoma], 2.0 parts by weight of dioctyl fumarate, 2.0 parts by weight of 2,2-dimethoxy phenyl acetophenone, 10 parts by weight of maleic modification product of polybutadiene (ME-1000-80: manufactured by Nippon Sekiyu Kagaku], 5 parts by weight of N-ethyltoluene sulfonamide and 0.5 parts by weight of 2,2-di-t-butyl-p-cresol were charged and kneaded in a double-screw extruder, to obtain a gel-like photosensitive resin composition having water-developability.

(3) Preparation of water-developable plate

A strip-shaped water-developable plate of 2.54 mm thickness was obtained by horizontally extruding the gel-like photosensitive resin composition obtained in (2) above from a double-screw extruder into a sheet shape and, at the same time, by sandwiching the sheet at upper and lower surfaces thereof, between PET films each of 100 $\mu$m thickness and roll pressing them under a predetermined condition. A rectangular plate of 1046 mm×762 mm, a normal square plate of 100 mm square and a rectangular plate of 1200 mm×2400 mm were cut out respectively from the strip-like plate.

As shown by the cross sectional view in FIG. 1, the water-developable plate 1 comprises a photosensitive layer 11 made of a photosensitive resin composition having water-developability and PET films (protective films) 12 covering both surfaces of the photosensitive layer 11, and has an entire thickness of 2.54 mm.

EXAMPLE 1

Ten sheets of water-developable plates each sized 1046 mm×762 mm (plate size: medium) obtained in (3) above were provided. Eleven ether type polyurethane foamed sheets ("FLZ10" manufactured by Bridgestone Co., thickness: 2 mm, air permeability: 20.0 cc/(cm$^2$· sec), density: 100 kg/m$^3$ and compression ratio: 6.2%) cut into the same size as the water-developable plate 1 were provided as the open cell foamed sheet 2. Further, as a substitute for hairs as a kind of dusts which have a high possibility of intrusion during lamination, nylon yarns each of 0.16 mm diameter and 4 cm length were provided.

Figure 2:
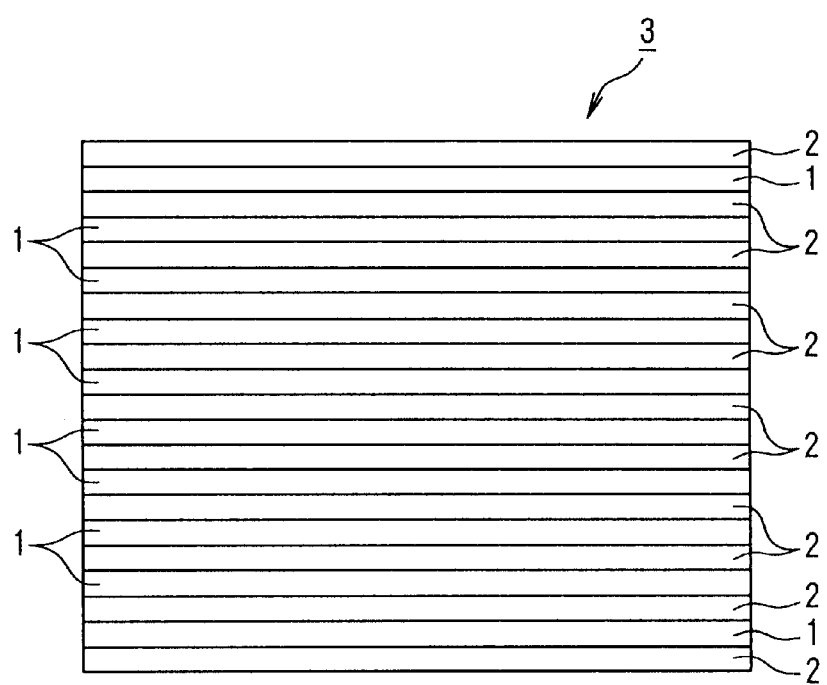
FIG. 2 is a schematic constitutional view showing a laminate of plates corresponding to an example of the present invention.
Figure 3:
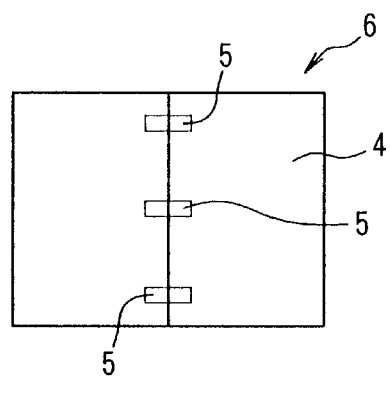
FIGS. 3(a) and (b) are an explanatory view showing a method of packaging a laminate of plates.
Figure 3:
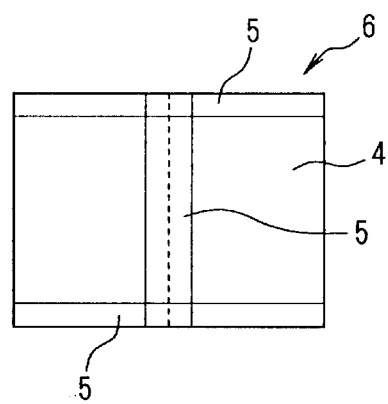

By using them and as shown in FIG. 2, laminating the foamed sheet 2, the water-developable plate 1, the foamed sheet 2, . . . alternately a laminate 3 in which an open cell foamed sheet 2 was sandwiched between the water-developable plates 1 and open cell foamed sheet 2 were disposed to the upper and lower surfaces was obtained. After leaving the laminate 3 for 7 days in a circumstance at a temperature of 30° C. and at a humidity of 80%, when the water-developable plate 1 was taken out and the degree of deformation was confirmed with naked eyes and feeling of touch, no deformation was recognized.

Further, as a test for examining the dust transferability, nylon yarns were placed between the lowermost foamed sheet 2 and the water-developable plate 1 thereon in the laminate 3 and they were left in a circumstance at a temperature of 30° C. and at a humidity of 80% for 7 days under a pressure of 3 g/cm$^2$. Subsequently, when it was confirmed whether concave traces conforming the shape of the nylon yarns were formed or not at the portions of the water-developable plate 1 in contact with the nylon yarns by naked eyes and feeling of touch, concave traces were not formed.

EXAMPLE 2

A laminate 3 identical with that of Example 1 was manufactured. The laminate 3 was packaged with a polyethylene film 4 of 70 $\mu$m thickness containing carbon black (light screening film) and only the packaging end was secured at several positions with tapes 5, to obtain a package 6. When a test for examining the deformation was conducted to the package 6 under the same conditions as those in Example 1, deformation was not recognized for the water-developable plate 1.

Further, after placing nylon yarns to the laminate identical with that of Example 1 in the same manner as in Example 1, the laminate was packaged in the same manner as described above to manufacture a package 6. When a test for examining the dust transferability was conducted under the same conditions as those in Example 1 by using the package, concave traces conforming the shape of the nylon yarns were not formed at the portions of the water-developable plate 1 in contact with the nylon yarns.

EXAMPLE 3

A laminate 3 of a structure identical with that of Example 1 was obtained by using an ester type polyurethane foamed sheet ("SO" manufactured by Bridgestone Co., thickness: 2 mm, air permeability: 40.0 cc/(cm$^2$·sec), density: 90 kg/m$^3$ and compression ratio: 13%) as the open cell foamed sheet 2. The laminate 3 was packaged in the same manner as in Example 2 to manufacture a package 6. When a test for examining deformation was conducted under the same conditions as those in Example 1 to the package 6, no deformation was recognized in the water-developable plate 1.

Further, after placing nylon yarns in the same manner as in Example 1 to the laminate, a package 6 was manufactured by packaging the laminate in the same manner as described above. When a test for examining the dust transferability was conducted under the same conditions as those in Example 1 by using the package, concave traces confirming the shape of the nylon yarns were not formed at the portions of the water-developable plate 1 in contact with the nylon yarns.

EXAMPLE 4

A laminate 3 of a structure identical with that of Example 1 was obtained by using an EPDM type rubber foamed sheet ("EVERLIGHTMORAN" manufactured by Bridgestone Co., thickness: 2 mm, air permeability: 3.0 cc/($cm^2$·sec), foaming factor: 6 times and compression ratio: 15%) as the open cell foamed sheet 2. The laminate 3 was packaged in the same manner as in Example 2 to manufacture a package 6. When a test for examining the deformation was conducted under the same conditions as those in Example 1 to the package 6, no deformation was recognized in the water-developable plate 1.

Further, after placing nylon yarns in the same manner as in Example 1 to the laminate, a package 6 was manufactured by packaging the laminate in the same manner as described above. When a test for examining the dust transferability was conducted under the same conditions as those in Example 1 by using the package, concave traces confirming the shape of the nylon yarns were not formed at the portions of the water-developable plate 1 in contact with the nylon yarns.

EXAMPLE 5

A laminate 3 of a structure identical with that of Example 1 was obtained by using an PE type rubber foamed sheet ("PE LIGHT RP30" manufactured by INOAC Corporation, thickness: 2 mm, air permeability: 3.0 cc/($cm^2$·sec) and compression ratio: 15%) as the open cell foamed sheet 2. The laminate 3 was packaged in the same manner as in Example 2 to manufacture a package 6. When a test for examining deformation was conducted under the same conditions as those in Example 1 to the package 6, no deformation was recognized in the water-developable plate 1.

Further, after placing nylon yarns in the same manner as in Example 1 to the laminate, a package 6 was manufactured by packaging the laminate in the same manner as described above. When a test for examining the dust transferability was conducted under the same conditions as those in Example 1 by using the package, concave traces confirming the shape of the nylon yarns were not formed at the portions of the water-developable plate 1 in contact with the nylon yarns.

EXAMPLE 6

A laminate 3 of a structure identical with that of Example 1 was obtained by using an polyurethane foamed sheet ("MF50" manufactured by INOAC Co., thickness: 2 mm, air permeability: 5.0 cc/($cm^2$·sec) and compression ratio: 0.7%) as the open cell foamed sheet 2. The laminate 3 was packaged in the same manner as in Example 2 to manufacture a package 6. When a test for examining the deformation was conducted under the same conditions as those in Example 1 to the package 6, no deformation was recognized in the water-developable plate 1.

Further, after placing nylon yarns in the same manner as in Example 1 to the laminate, a package 6 was manufactured by packaging the laminate in the same manner as described above. When a test for examining the dust transferability was conducted under the same conditions as those in Example 1 by using the package, it was confirmed that concave traces confirming the shape of the nylon yarns were formed at the portions of the water-developable plate 1 in contact with the nylon yarns. By using the water-developable plate 1, a printing plate in which the portions formed with the concave traces were printed solid (area to be coated entirely), and when printing was conducted to paper by using the printing plate, the shape of the nylon yarns was not transferred.

EXAMPLE 7

Ten sheets of water-developable plates 1 each sized 1200 mm×2400 mm (plates size: large) obtained in (3) above were provided. Eleven sheets of the same ether type polyurethane foamed sheets as in Example 1 cut out in the same size as the water-developable plate 1 were provided as the open cell foamed sheet 2.

A laminate 3 of the structure identical with that of Example 1 was manufactured by using them. The laminate 3 was packaged in the same manner as in Example 1 to manufacture a package 6. When a test for examining the deformation was conducted under the same conditions as those in Example 1 to the package 6, deformation was not recognized in the water-developable plate 1.

Further, after placing nylon yarns in the same manner as in Example 1 to the laminate, the laminate was packaged in the same manner as described above to manufacture a package 6. When a test for examining the dust transferability was conducted under the same conditions as those in Example 1 by using the package, concave traces conforming the shape of the nylon yarns were not formed at the portions of the water-developable plate 1 in contact with the nylon yarns.

Comparative Example 1

Figure 4:
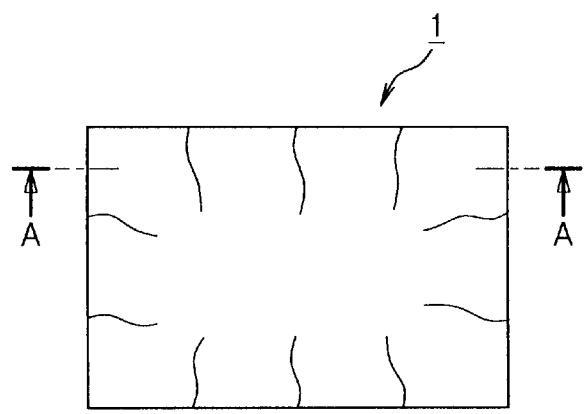
FIGS. 4(a) and (b) are a plan view and a cross sectional view illustrating deformation caused to a plate in a laminate of plates corresponding to a comparative example in the present invention.
Figure 4:

A laminate was manufactured by laminating only ten sheets of the same water-developable plates 1 as in Example 1 but not using the foamed sheet 2. When a test for examining the deformation was conducted under the same conditions as those in Example 1 to the laminate, a deformation as shown in FIG. 4 was recognized in the water-developable plate 1. FIG. 4(a) is a plane view of the water-developable plate 1 and FIG. 4(b) is a cross sectional view taken along line A—A thereof. That is, the thickness of the photosensitive layer 11 in the vicinity of the central area of the water-developable plate 1 was in a state not substantially different from that before the test, but swelling was caused to the photosensitive layer 11 at the portions in the vicinity of four end faces (edges) to cause corrugating deformation as shown in FIG. 4(b).

Further, when nylon yarns was placed between the lowermost water-developable plate 1 and the water-developable plate 1 thereon in the laminate and a test for examining the dust transferability was conducted under the same conditions as those in Example 1 to this laminate, it was confirmed that concave traces conforming the shape of the nylon yarns were formed at the portions of the water-developable plate 1 in contact with the nylon yarns. Further, when the printing plate was manufactured from the water-developable plate 1 and printing was conducted using the thus obtained printing plate like that in Example 6, shape of the nylon yarns was transferred.

Comparative Example 2

A laminate identical with that of Comparative Example 1 was manufactured. The laminate was packaged in the same manner as in Example 2 to manufacture a package 6. When a test for examining the deformation was conducted under the same conditions as those in Example 1 to the package 6, identical deformation with that in Comparative Example 1 was recognized in the water-developable plate 1.

Further, nylon yarns were placed between the lowermost water-developable plate 1 and the water-developable plate 1 thereon to the laminate identical with that of Comparative Example 1 and then the laminate was packaged in the same manner as described above to manufacture a package 6. When a test for examining the dust transferability was conducted under the same conditions as those in Example 1 by using this package, it was confirmed that concave traces conforming the shape of the nylon yarns were formed at the portions of the water-developable plate 1 in contact with the nylon yarns. Further, when the printing plate was manufactured from the water-developable plate 1 and printing was conducted using the thus obtained printing plate like that in Example 6, shape of the nylon yarns was transferred.

Comparative Example 3

Ten sheets of the water-developable plates 1 identical with those of Example 1 and eleven closed cell foamed sheet of 2 mm thickness (material: polyethylene, foaming factor: 30 times and compression ratio: 2.6%) cut out into the same size as the water-developable plate 1 were provided. They were laminated alternately to obtain a laminate in which a closed cell foamed sheet is sandwiched between the water-developable plates 1 and closed cell foamed sheet are disposed on the upper and lower surfaces. The laminate was packaged in the same manner as in Example 2 to manufacture a package 6. When a test for examining the deformation was conducted under the same conditions as those in Example 1 to the package 6, identical deformation with that in Comparative Example 1 was recognized in the water-developable plate 1.

Further, a package 6 was manufactured by placing nylon yarns between the lowermost foamed sheet and the water-developable plate 1 thereon to this laminate and packaging the laminate in the same manner as described above. When a test for examining the dust transferability was conducted under the same conditions as those in Example 1 by using the package, concave traces conforming the shape of the nylon yarns were not formed at the portions of the water-developable plate 1 in contact with the nylon yarns.

Comparative Example 4

Ten sheets of water-developable plates 1 identical with those of Example 1, and eleven sheets of paper of 1 mm thickness cut out into the same size as that for the water-developable plate 1 were provided and they were laminated alternately to obtain a laminate in which paper is sandwiched between the water-developable plates 1 and paper is disposed on each of the upper and lower surfaces. The laminate was packaged in the same manner as in Example 2 to manufacture a package 6. When a test for examining the deformation was conducted under the same conditions as those in Example 1 to the package 6, deformation was not recognized in the water-developable plate 1.

Further, a package 6 was manufactured by placing nylon yarns between the lowermost paper and the water-developable plate 1 thereon to this laminate and then packaging the laminate in the same manner as described above. When a test for examining the dust transferability was conducted under the same conditions as those in Example 1 by using the package, it was confirmed that concave traces conforming the shape of the nylon yarns were formed at the portions of the water-developable plate 1 in contact with the nylon yarns. Further, like that in Example 6, when a printing plate was manufactured from the water-developable plate 1 and printing was conducted by the thus obtained printing plate, the shape of the nylon yarns was transferred.

Comparative Example 5

A laminate of a structure identical with that of Comparative Example 1 was obtained by laminating 10 sheets of water-developable plates 1 each of 100 mm square (plate size: small) obtained in (3) above. The laminate was packaged in the same manner as in Example 2 to manufacture a package 6. When a test for examining the deformation was conducted under the same conditions as those in Example 1 to the package 6, the deformation was not recognized in the water-developable plate 1.

Further, a package 6 was manufactured by placing nylon yarns between the lowermost paper and the water-developable plate 1 thereon to this laminate and then packaging the laminate in the same manner as described above. When a test for examining the dust transferability was conducted under the same conditions as those in Example 1 by using the package, it was confirmed that concave traces conforming the shape of the nylon yarns were formed at the portions of the water-developable plate 1 in contact with the nylon yarns. Further, like that in Example 6, when a printing plate was manufactured from the water-developable plate 1 and printing was conducted by the thus obtained printing plate, the shape of the nylon yarns was transferred.

Test results for the examples and the comparative examples are collectively shown in the following Table 1.

Further, after conducting the test for examining the deformation, water content at the central area and the edges of the photosensitive layer was measured by using the fifth water-developable plate 1 from the bottom of the water-developable plates 1 for each of the laminates. As the result of the measurement for the water content in the edges, it was 8000 ppm for all of the examples and the comparative examples. The results for the measurement of the water content in the central area were also shown together in the following Table 1. The water content in the photosensitive layer just before starting the test for examining the deformation was 700 ppm both for the central area and the edges.

TABLE 1

|  | Plate size | Kind of interposed sheet | Degree of deformation | water content (ppm) | Dust transferability |
|---|---|---|---|---|---|
| Example 1 | medium | open cellular | ◯ | 4500 | ◯ |
| Example 2 | medium | open cellular | ◯ | 3000 | ◯ |
| Example 3 | medium | open cellular | ◯ | 3100 | ◯ |

TABLE 1-continued

| | Plate size | Kind of interposed sheet | Degree of deformation | water content (ppm) | Dust transferability |
|---|---|---|---|---|---|
| Example 4 | medium | open cellular | ○ | 3100 | ○ |
| Example 5 | medium | open cellular | ○ | 3100 | ○ |
| Example 6 | medium | open cellular | ○ | 2900 | Δ |
| Example 7 | large | open cellular | ○ | 2900 | ○ |
| Comp. Example 1 | medium | none | X | 1000 | x |
| Comp. Example 2 | medium | none | X | 900 | x |
| Comp. Example 3 | medium | closed cellular | X | 900 | ○ |
| Comp. Example 4 | medium | paper | ○ | 3000 | x |
| Comp. Example 5 | small | none | ○ | 3500 | x |

Degree of deformation:
○: deformation was not recognized
X: deformation was recognized
Dust transferability:
○: concave traces by nylon yarns were not formed
Δ: concave traces by nylon yarns were formed, but the shape of nylon yarns was not transferred when conducting printing using the water-developable plate as a printing plate
x: concave traces by nylon yarns were formed, and the shape of nylon yarns was transferred when conducting printing using the water-developable plate as a printing plate As can be seen from the table, laminates (packages) for Examples 1–7 have higher hygroscopicity at the central areas of the water-developable plates 1, because a open cell foamed sheet 2 is sandwiched between each of the water-developable plates 1, as compared with laminates (packages) of Comparative Examples 1–3. From this result, it can be seen that the ununiformity of hygroscopicity in the plane of the water-developable plate 1 is moderated and deformation is suppressed. Further, it can be seen that the laminates (packages) of Examples 1–7 have no particular problems also with respect to the dust transferability.

However, Example 6 still has a room for improvement with respect to the dust transferability, since the compression ratio of the open cell foamed sheet is relatively low as 0.7%. Accordingly, it is more preferred that the compression ratio of the open cell foamed sheet is, for example, 5.0% or more.

Further, it can be seen that the hygroscopicity is relatively higher at central areas of the water-developable plate 1 and deformation is not caused to the water-developable plate 1 in both Comparative Example 4 and Comparative Example 5, since paper is sandwiched between each of the water-developable plates 1 in Comparative Example 4 and since the plate size is small in Comparative Example 5, but these involve a problem with respect to the dust transferability.

INDUSTRIAL APPLICABILITY

As has been described above, according to the water-developable plate package of the present invention, it is possible to prevent deformation to the plate of a package in which water-developable plates are packaged in a laminated state, during transportation or storage at a high temperature and a high humidity in summer. Further, it does not complicate the operation in the use and packaging of the plates or increase the cost remarkably. Further, even when the plates are laminated in a state with deposition of dusts on the outer surfaces of the protective films, the foamed sheets function as a buffer material to suppress the formation of unevenness caused by dusts to the photosensitive layer.

What is claimed is:

1. A water-developable plate package comprising plates, wherein said plates each comprises a photosensitive layer made of a photosensitive resin composition having water-developability and protective films covering both surfaces of the photosensitive layer which are packaged in a laminated state for transportation or storage, wherein an open cell foamed sheet is sandwiched between two of said plates.

2. A water-developable plate package as defined in claim 1, wherein the foamed sheet has an air permeability of 0.1 cc/(cm$^2$·sec) or more based on air permeability measurement according to JIS L-1096 A and a compression ratio of between 0.5% and 50.0% in the direction of the thickness under a pressure of 30 g/cm$^2$.

3. A water-developable plate package as defined in claim 2, wherein the plates are formed into sheet shape of a thickness of between 0.5 mm and 10 mm and having a square lane with a length of 700 mm or greater for each side or a rectangular plane with a length of 700 mm or greater for each two sides orthogonal to each other.

4. A water-developable plate package as defined in claim 1, wherein the plates are formed into sheet shape of a thickness of between 0.5 mm and 10 mm and having a square lane with a length of 700 mm or greater for each side or a rectangular plane with a length of 700 mm or greater for each two sides orthogonal to each other.

\* \* \* \* \*